United States Patent [19]

Raber

[11] Patent Number: 5,747,181
[45] Date of Patent: *May 5, 1998

[54] SUPERCONDUCTIVE ARTICLE AND METHOD OF MAKING

[75] Inventor: Thomas Robert Raber, East Berne, N.Y.

[73] Assignee: General Electric Company, Schenectady, N.Y.

[*] Notice: The term of this patent shall not extend beyond the expiration date of Pat. No. 5,656,380.

[21] Appl. No.: 505,937

[22] Filed: Jul. 24, 1995

[51] Int. Cl.$^6$ .................. G12B 17/02; B32B 3/10; B32B 7/04
[52] U.S. Cl. .................. 428/614; 428/662; 428/930; 29/599; 174/35 MS; 505/813; 505/925; 505/926; 505/927
[58] Field of Search .................. 428/660, 614, 428/662, 930; 174/35 MS; 29/599; 505/925, 926, 927, 812, 813, 919, 918

[56] References Cited

U.S. PATENT DOCUMENTS

| | | | |
|---|---|---|---|
| 3,416,917 | 12/1968 | Sorbo | 75/174 |
| 3,429,032 | 2/1969 | Martin et al. | 29/599 |
| 3,473,217 | 10/1969 | Prior | 29/599 |
| 3,537,827 | 11/1970 | Benz et al. | 29/194 |
| 3,603,716 | 9/1971 | Koren | 174/35 MS |
| 3,661,639 | 5/1972 | Caslaw | 117/213 |
| 3,728,165 | 4/1973 | Howlett | 428/930 |
| 4,126,287 | 11/1978 | Mendelsohn et al. | 174/35 MS |
| 4,161,062 | 7/1979 | Agatsuma et al. | 505/927 |
| 5,104,030 | 4/1992 | Ranze | 505/927 |
| 5,109,593 | 5/1992 | Benz et al. | 29/599 |
| 5,117,065 | 5/1992 | Savage | 174/35 MS |
| 5,134,040 | 7/1992 | Benz et al. | 428/646 |
| 5,239,156 | 8/1993 | Jones et al. | 219/121.63 |
| 5,373,275 | 12/1994 | Itoh et al. | 174/35 MS |

FOREIGN PATENT DOCUMENTS

| | | | |
|---|---|---|---|
| 41353 | 9/1956 | Germany | 174/35 MS |
| 960107 | 3/1957 | Germany | 174/35 MS |
| 2-276180 | 11/1990 | Japan | 29/599 |
| 4-10698 | 1/1992 | Japan | 174/35 MS |
| 6-224591 | 8/1994 | Japan | 174/35 MS |
| WO 86/05062 | 8/1986 | WIPO | 174/35 MS |

OTHER PUBLICATIONS

Caslaw, J.S. "Enhancement of the critical current density in niobium–tin". Cryogenics, Feb. 1971.

Benz, M..G. Superconducting Properties of Diffusion Processd Niobium–Tin Tape. IEEE, vol. Mag–2, No. 4., Dec. 1966.

M.G. Benz et al. Melt–Formed Superconducting Joints for Nb Sn Tape. Journal of Electronic Materials, vol. 22, No. 10, Jun. 1993.

U.S. application No. 08/415,969, (Patent Attorney Docket RD–23,496), filed Apr. 3, 1995.

U.S. application No. 08/406,443, (Patent Attorney Docket RD–23,439), filed Mar. 20, 1995.

*Primary Examiner*—John Zimmerman
*Attorney, Agent, or Firm*—Ernest G. Cusick; William H. Pittman

[57] ABSTRACT

A superconductive article is made from interconnected superconductive, metallic tapes. The tapes preferably are mechanically joined and electrically interconnected by a plurality of superconductive interconnections that extend between the tapes. The interconnections are formed by overlapping the edges of two tapes and forming a plurality of superconductive welds between the tapes in the overlapping regions. Articles of this invention may be formed from superconductive tapes made from $Nb_3Sn$ having superconductive interconnections that also include $Nb_3Sn$.

21 Claims, 5 Drawing Sheets

SUPERCONDUCTIVE ARTICLE AND METHOD OF MAKING

FIELD OF THE INVENTION

This invention is related generally to articles made from metallic superconductors. Specifically, this invention comprises superconductive metallic articles that are formed from mechanically joined and electrically interconnected superconductive, metallic tapes. The invention also comprises a method of making such articles.

BACKGROUND OF THE INVENTION

Superconductivity is that characteristic of certain materials which permits them to conduct electric currents without resistance. A superconducting material exhibits this characteristic only when its temperature is below the superconducting critical temperature of the material and then only if it is not subject either to a magnetic field greater than the superconducting critical magnetic field of the material or to an electric current greater than the superconducting critical current of the material. Accordingly, a superconductive material can be quenched (i.e. returned to a resistive state) by increasing the temperature, magnetic field, or current to which the material is subjected above the critical temperature, critical magnetic field, or critical current. In a given material, quenching of the superconductivity may occur abruptly or more gradually depending upon the breadth of its superconducting transition state with respect to temperature, magnetic field or current.

Briefly stated, with regard to metallic superconductors it is known that selected parent-metals, either pure or preferably containing minor solute-metal alloying additions, are capable of being alloyed with other reactive-metals and forming superconducting compounds or alloys that have a high current-carrying capacity. The parent-metals niobium, tantalum, technetium, and vanadium can be reacted or alloyed with reactive-metals, such as tin, aluminum, silicon, and gallium to form superconducting alloys, such as the intermetallic $Nb_3Sn$.

Additionally, it is known that the superconductive characteristics of various parent-metals can be improved by first alloying the parent-metal, i.e., niobium, tantalum, technetium, and vanadium, with a minor amount of a solute-metal having an atom diameter of at least 0.29 angstroms larger than the diameter of the parent-metal atom prior to reacting the reactive-metal with the parent-metal. A broad disclosure of various parent-metals, solute- metals, and reactive-metals can be found in U.S. Pat. No. 3,416,917, which is incorporated herein by reference. Of the various possible combinations of the materials mentioned above, it is known that niobium is an extremely useful parent-metal, particularly when reacted with the reactive-metal, tin to form $Nb_3Sn$. This intermetallic compound has superior superconducting properties. More specifically, U.S. Pat. No. 3,429,032, which is incorporated herein by reference, discloses improved critical currents in superconductive $Nb_3Sn$ alloys formed when the parent-metal niobium also contains zirconium, in an amount of at least 0.1 weight percent and up to an amount equivalent to the ratio represented by the formula $Nb_2Zr$, and is heated in the presence of excess tin, and a non-metal selected from the group consisting of oxygen, nitrogen, and carbon.

Metallic superconductors, particularly those comprising $Nb_3Sn$, have been fabricated in various forms, particularly wires and tapes, in efforts to produce devices such as high field superconducting electromagnets. Superconductive metallic devices of laminated construction having an elongated tape or strip configuration and the methods of producing such superconductive tapes are well known. For example, British patent 1,254,542 discloses improved superconducting tapes, and methods of forming the improved tapes. In particular, superconducting tapes of niobium tin alloy are made by treating niobium tape having a zirconium content to provide an oxygen content of 500–5000 ppm in at least a surface layer of said tape and subsequently depositing tin over said surface layer and thereafter heat treating the oxygen containing tape to produce the superconducting niobium tin alloy. Preferably the oxygen content is arranged to be about 2000 or 3000 ppm. U.S. Pat. No. 3,537,827, incorporated by reference herein, discloses improvements in laminating superconductive tapes and methods for producing the laminated tapes. One method for obtaining superconducting tape in a continuous fashion is that wherein a tape of a preselected parent-metal, such as niobium or niobium alloy, (e.g. an Nb—Zr alloy) is continuously led through a bath of molten reactive-metal such as tin or a tin alloy, such as a tin-copper alloy. The niobium tape picks up a thin coating of the reactive-metal from the molten bath and the tape is subsequently heated in a reaction furnace to cause formation of the superconductive $Nb_3Sn$ alloy on the surface of the parent-metal tape. It is also known that the reactive-metals can be alloyed to further improve the superconductive tape. For example, the critical current density of triniobium tin has been improved by making copper additions of up to 45 weight percent copper in the reactive-metal tin for coating on niobium tape as disclosed in, "Enhancement of the Critical Current Density in Niobium-Tin" J. S. Caslaw, Cryogenics, February 1971, pp. 57–59.

Methods for making superconductive joints between superconductive tapes, such as triniobium tin tapes, are well-known as described in U.S. Pat. Nos. 5,109,593 and 5,134,040. However, most of the development of fabrication techniques related to superconductive tapes has been directed toward joining techniques for forming continuous lengths of wire or tape. It is also desirable to form larger superconductive articles from these tapes. For example, larger superconductive articles made from these superconductive tapes could be used for electromagnetic shielding for applications which must be isolated from large magnetic fields. One desirable application might be as a passive shield for the gradient coil in a magnetic resonance imaging (MRI) apparatus. As is known, in MRI apparatuses superconductive gradient coils generate large magnetic fields in an annular imaging chamber. It is known that these magnetic fields also extend outside the ends of the annular chamber and bend back onto the MRI apparatus, including the gradient coils. Because these stray magnetic fields affect performance of the MRI, it is desirable to provide magnetic shielding around the exterior of the gradient coils. Because of the significant strength of these stray fields and other system constraints such as the desire to minimize the overall system size and minimize the required cooling capacity required for the shield, it would be desirable to form such shielding from a superconductive material. For example, a large 1–2 m diameter superconductive right circular cylinder having a length of about 1–3 m would be a desirable configuration for surrounding an MRI gradient coil. However, once a superconductive metallic tape is reacted to form the superconductive material, it is known that they become relatively brittle due to the brittle nature of the $Nb_3Sn$ intermetallic compound that is formed.

Therefore, it is also desirable to develop methods for forming superconductive articles from superconductive tapes that accommodate the brittle characteristics of these materials in their reacted state.

SUMMARY OF THE INVENTION

This invention describes superconductive articles that are formed from interconnected superconductive tapes, such as those comprising $Nb_3Sn$. The invention also comprises a method of making such articles.

The present invention may be described as a superconductive article, comprising: a first metallic tape comprising a first superconductive portion, a first longitudinal axis and two opposed tape edge regions; a second metallic tape comprising a second superconductive portion, a second longitudinal axis and two opposed tape edge regions, wherein one of the edge regions of said first tape overlaps and is in touching contact with one of the edge regions of said second tape, thereby forming an area for interconnecting said first tape and said second tape; joining means providing a mechanical interconnection between said first tape and said second tape in the area for interconnecting; and superconductive interconnection means providing a superconductive electrical interconnection between the first superconductive portion and the second superconductive portion in the area for interconnecting, wherein the mechanically and superconductively interconnected first and second tapes comprise a superconductive article.

One method of making these superconductive articles, may be described as comprising the steps of: selecting a first metallic tape comprising a first superconductive portion, a first longitudinal axis and two opposed tape edge regions and a second metallic tape comprising a second superconductive portion, a second longitudinal axis and two opposed tape edge regions; placing the first tape together with the second tape so that one of the edge regions of the first tape overlaps and is in touching contact with one of the edge regions of the second tape, thereby forming an area for mechanically and electrically interconnecting the first tape and the second tape; mechanically joining the first tape and the second tape in the area for interconnecting with a mechanical joining means; electrically connecting the first superconductive portion and the second superconductive portion with a superconductive interconnection means in the area for interconnecting. In this method, the article is formed from reacted superconductive tapes that are joined by a superconductive interconnection.

Another method of making these superconductive articles, may be described as comprising the steps of: selecting a first metallic precursor tape having a first longitudinal axis and two opposed tape edge regions, that is adapted to form a first superconductive tape having a first superconductive portion; selecting a second metallic precursor tape having a second longitudinal axis and two opposed tape edge regions, that is adapted to form a second superconductive tape having a second superconductive portion; placing the first precursor tape together with the second precursor tape so that one of the edge regions of the first tape overlaps and is in touching contact with one of the edge regions of the second tape, thereby forming an area for mechanically and electrically interconnecting the first precursor tape and the second precursor tape; mechanically joining the first precursor tape and the second precursor tape in the area for interconnecting with a mechanical joining means; electrically connecting the first precursor tape and the second precursor tape with a superconductive interconnection means in the area for interconnecting; and reacting the first precursor tape and the second precursor tape to form the first superconductive tape and the second superconductive tape, whereby the first superconductive portion and the second superconductive portion are electrically connected by the superconductive interconnection means. In this method, a precursor article is formed from unreacted tapes that are joined with superconductive interconnections, and the precursor tapes are reacted to form superconductive tapes that are joined by the superconductive interconnection.

A principal advantage of the present invention is that it permits the creation of superconductive articles that are larger than those that may be fashioned from a single superconductive tape.

DETAILED DESCRIPTION OF THE INVENTION

This invention describes a superconductive article that is formed by mechanically joining and electrically interconnecting a plurality of superconductive tapes and a method of making these articles. Articles of the present invention comprise a plurality of superconductive tapes which overlap one another along their edges where they are mechanically joined and electrically interconnected by a joining means and a superconductive interconnection means. Superconductive articles of the present invention may be made in a variety of shapes and sizes including flat, planar arrays and shapes that may be formed from such arrays, such as a hollow right circular cylinder.

Figure 1:
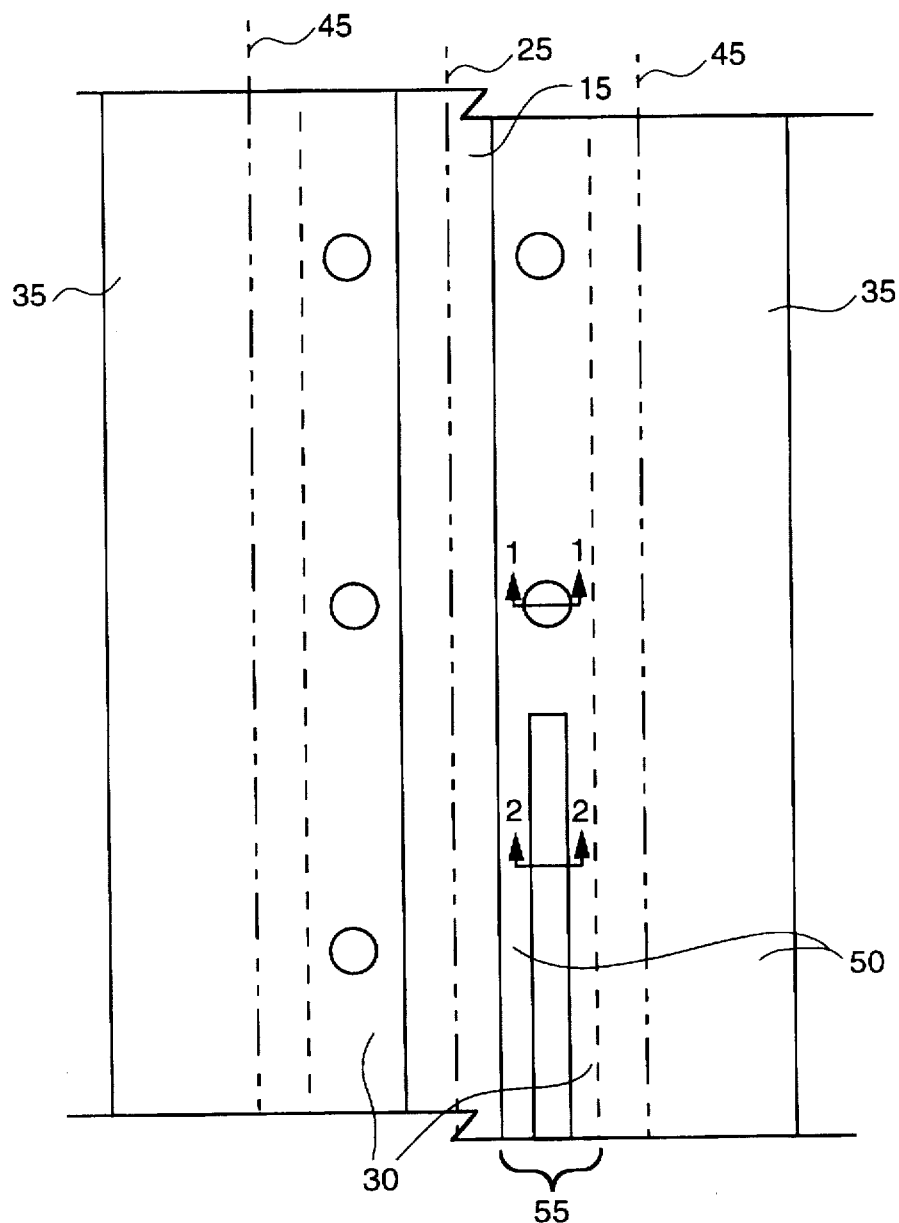
FIG. 1 is an illustration of a top view of an article of the present invention.
Figure 1A:
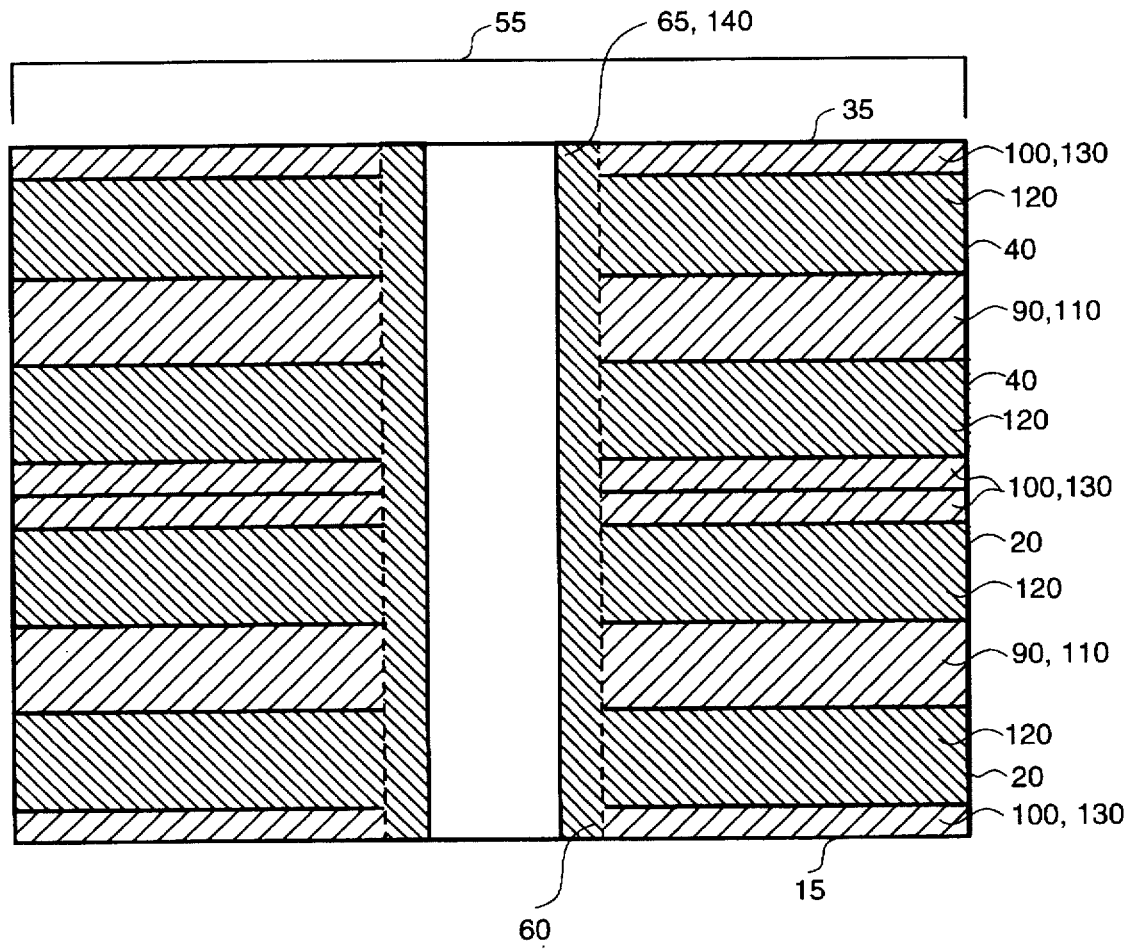
FIG. 1A is a cross-sectional view of the article of FIG. 1 along section line 1—1.

FIGS. 1 and 1A illustrate one embodiment of a superconductive article 10 of the present invention in the form of a flat, planar array. Superconductive article 10 comprises a first metallic tape 15 comprising first superconductive portion 20, first longitudinal axis 25 and two opposed tape edge regions 30. Superconductive article 10 also comprises second metallic tape 35 comprising a second superconductive portion 40, second longitudinal axis 45 and two opposed tape edge regions 50. One edge region 30 of first tape 15 overlaps and is in touching contact with one edge region 50 of second tape 35, thereby forming area for interconnecting 55 comprising the area where first tape 15 and second tape 35 overlap. Referring to FIG. 1A, joining means 60 provides a mechanical interconnection between first tape 15 and said second tape 35 in area for interconnecting 55. Superconductive interconnection means 65 provides superconductive electrical interconnection between first superconductive portion 20 and the second superconductive portion 40 in area for interconnecting 55. The mechanically and superconductively interconnected first tape 15 and second tape 35 comprise superconductive article 10. This arrangement may be repeated with a plurality of first tapes 15 and second tapes 35, as also illustrated in FIG. 1.

First tape 15 and second tape 35 are made from metallic superconductors of a type well known in the art. They may comprise any superconductive metallic material, but are preferably from the group consisting of niobium-base, tantalum-base, technetium-base and vanadium-base alloys with at least one alloy constituent from the group consisting of tin, aluminum, silicon and gallium. Tapes comprising the superconductive metallic material $Nb_3Sn$ are preferred, primarily due to the commercial availability and superconductive characteristics of this material, and are used herein as the illustrative embodiment of the present invention. Applicants believe that for most applications, it is preferred that first tape 15 and second tape 35 also comprise the same superconductive metallic material, but first tape 15 and second tape 35 may comprise different superconductive materials, including different alloy compositions of the same materials.

Figure 2:
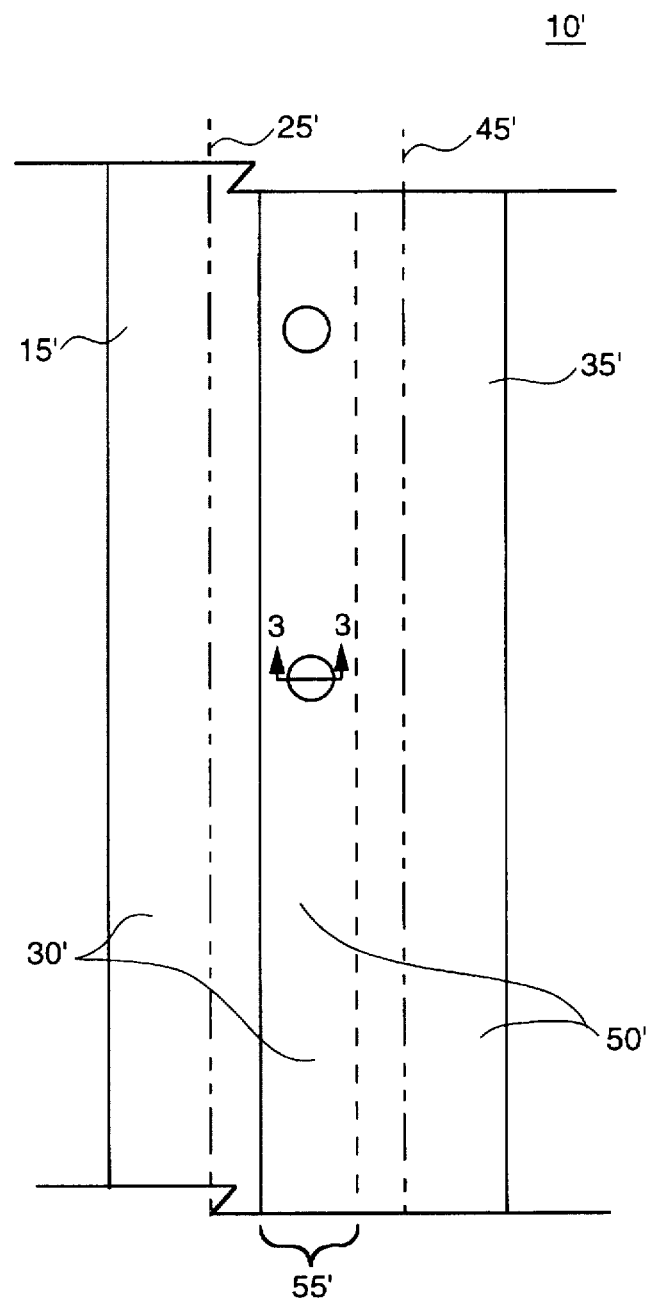
FIG. 2 is an illustration of a top view of mechanically and electrically interconnected precursor tapes.
Figure 2A:
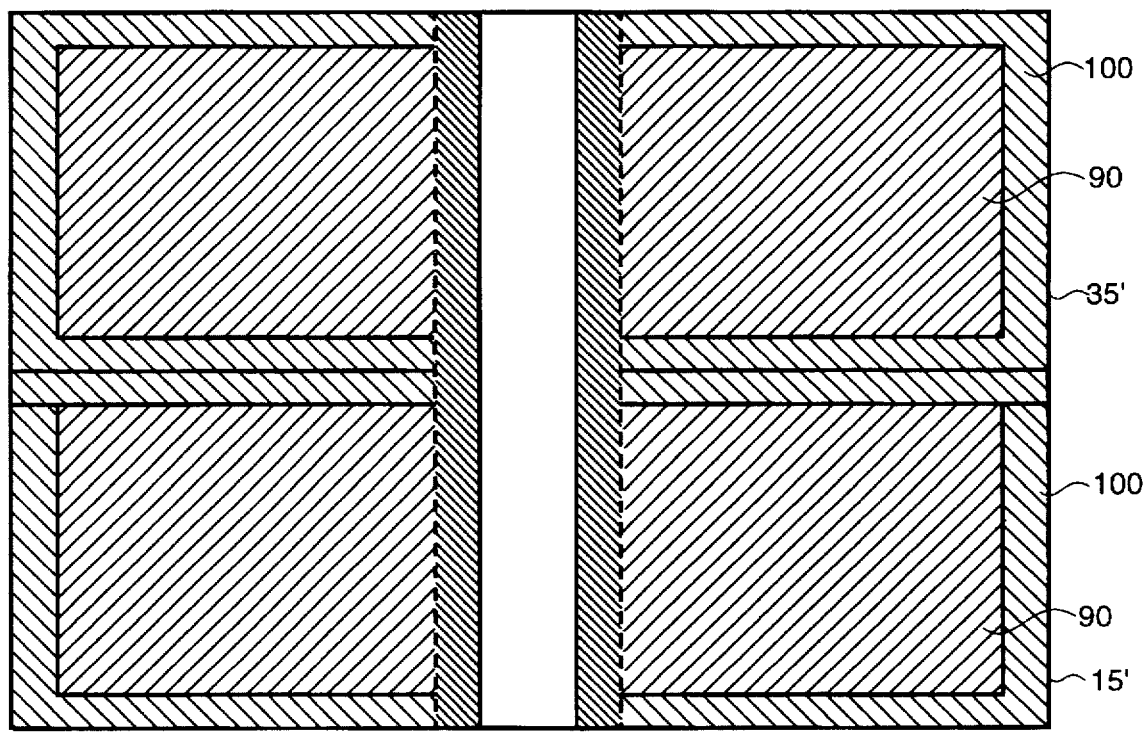
FIG. 2A is a cross-sectional view of the article of FIG. 2 along section line 3—3.

Superconductive $Nb_3Sn$ tapes are well known in the art being described, for example, in "Superconducting Properties of Diffusion Processed Niobium-Tin Tape", M. Benz, I.E.E.E. Transactions of Magnetics, Vol. Mag-2 No. 4, December 1966, pp. 760–764. Superconductive $Nb_3Sn$ tapes are formed from precursor tapes that comprise niobium coated with tin. FIGS. 2 and 2A illustrate first precursor tape 15' and second precursor tape 35' that each comprise a niobium-base tape 90 and a tin or a tin alloy reactive-metal coating 100. The parent-metal niobium-base tape 90 also typically has solute-metal additions of zirconium (not shown). Niobium-base tape 90 is preferably an alloy of up to about 5 atomic percent zirconium, up to about 10 atomic percent oxygen and a balance of niobium, and most preferably an alloy of about 1 atomic percent zirconium, 2 atomic percent oxygen and a balance of niobium. The addition of zirconium and oxygen are known to improve the critical current density in the resulting $Nb_3Sn$ when the niobium-base tape and tin alloy are reacted. Tin coating 100 may be a pure tin coating, but is preferably a tin-copper alloy coating comprising up to about 45 atomic percent copper and the balance tin, excepting impurities, and is most preferably an alloy coating comprising about 32 atomic percent copper and the balance tin, excepting impurities. Tin or tin alloy coating 100 is frequently applied to both sides of niobium-base tape 90 by passing the tape through a melt of the tin or tin alloy. This tin-coated niobium-base tape is referred to as an "unreacted tape", and is illustrated in FIGS. 2 and 2A as first precursor tape 15' and second precursor tape 35'. These unreacted tapes require an additional reactive step to form the superconductive $Nb_3Sn$. Precursor tapes may be of any desired thickness, but are frequently on the order of 75–100 microns thick, wherein the niobium-base alloy core is approximately 25 microns thick and the two-sided tin or tin alloy coating is about 25 microns thick.

Figure 1B:
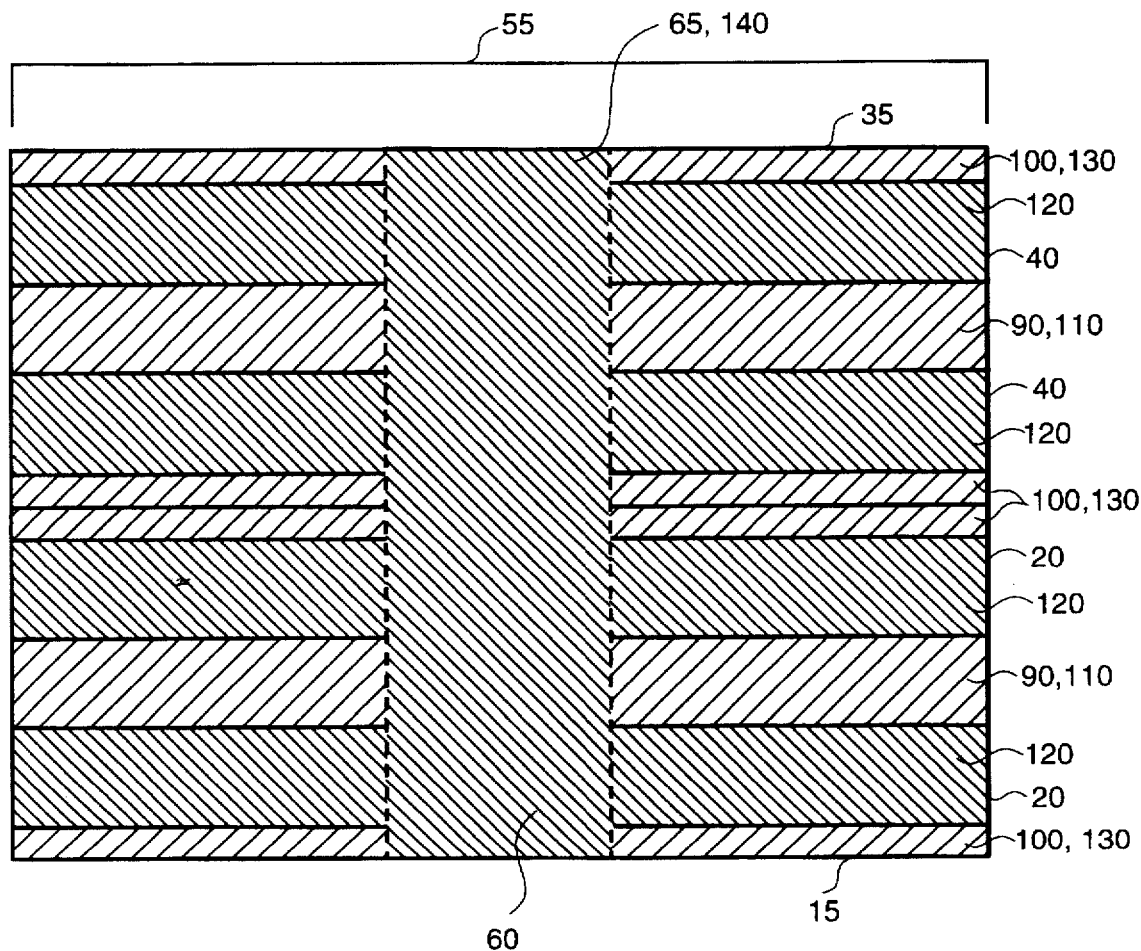
FIG. 1B is a cross-sectional view of the article of FIG. 1 along section line 2—2.

For tin alloy coated niobium-base tapes, the $Nb_3Sn$ is formed by a reactive step comprising an anneal in an argon atmosphere at a temperature of about 950°–150° C. Depending on factors such as the thickness of the unreacted niobium-base tape and the desired thickness of the $Nb_3Sn$ reaction layers, the reaction may require 2–5 minutes or more. FIGS. 1A and 1B illustrate "reacted" tapes in the form of first tape 15 and second tape 35. The numbering of portions of FIGS. 1, 1A and 1B and 2 and 2A are consistent to illustrate the changes which occur as a precursor tape is reacted as described herein. A typical example of a reacted tape has a thickness of about 33 microns. This includes a core 110 of the remaining parent-metal niobium-base alloy tape 90 having a thickness of about 11 microns, a layer of $Nb_3Sn$ 120 on either side of core 110 having a thickness of about 8 microns and a layer 130 of the unreacted tin or tin alloy coating 100 covering both of $Nb_3Sn$ layers 120 having a thickness of about 3 microns.

Joining means 60 maybe any suitable means for providing a mechanical interconnection between first tape 15 and second tape 35, such as separate fasteners, a continuous weld or a plurality of welds, mechanical crimping, or other suitable means. The requirements for joining means 60 will depend upon the intended application of the superconductive article 10, and the stresses and strains to be incurred in area for interconnecting 55. It is preferred that joining means 60 comprise a weld between first tape 15 and second tape 35 as described herein, wherein the weld also comprises superconductive interconnection means 65. In the case of first tape 15 and second tape 35 comprising $Nb_3Sn$, the weld tape 15 and second tape 35 comprising $Nb_3Sn$, the weld would also comprise $Nb_3Sn$, as described herein. While a weld, such as one comprising $Nb_3Sn$, may be sufficient joining means for some applications, the fact that $Nb_3Sn$ is known to be brittle may necessitate that joining means 60 also employ additional known mechanical interconnection means, such as described above, to join first tape 15 and second tape 35 in area for interconnecting 55.

Superconductive interconnection means 65 maybe any suitable means for providing a superconductive electrical interconnection 70 between first superconductive portion 20 of first tape 15 and second superconductive portion 40 of second tape 35 in area for interconnecting 55. It is preferred that superconductive interconnection means 65 be a weld comprising a superconductive material. In the case of first tape 15 and second tape 35 made from $Nb_3Sn$, superconductive interconnection means 65 may comprise a weld between these tapes which also comprises superconductive $Nb_3Sn$. Such a weld is illustrated in FIGS. 1, 1A and 1B. Such a weld may have the form of a ring of superconductive material as illustrated in FIGS. 1, 1A and described herein. The weld may also have the form, illustrated in FIGS. 1 and 1B, wherein the weld is in the form of a continuous weld bead.

Superconductive interconnections 65 in the form of a weld, such as are illustrated in FIGS. 1, 1A, and 1B. A method of forming these superconductive interconnections is similar to those described in U.S. Pat. Nos. 5,109,593, 5,134,040 and 5,239,156, which are hereby incorporated by reference. However, rather than forming butt joint interconnections as described in the referenced patents, it is possible to form through-hole superconductive interconnections 85 by using a combination of an upper and a lower copper chill plate (not shown). These chill plates each contain a bore that extends through the plate. In use, the chill plates are aligned such that the bores in the two plates are directly in line with one another, with an overlapping region of first tape 15 and a second tape 35 pressed in between so as to establish good thermal contact between the chill plates and the tapes, thereby allowing the chill plates to dissipate heat produced during the welding. A tungsten inert gas (TIG) welding electrode and apparatus or other suitable apparatus may then be utilized to melt the portion of the overlapping region that is exposed within the bores of the chill plates. The TIG arrangement permits this melting to be done in an protective atmosphere, such as an argon atmosphere. The zone within the bore is melted, and surface tension and other effects cause the molten material to pull back forming a ring of material that resolidifies upon cooling. The ring of resolidified material comprises $Nb_3Sn$ layer 140 that connects first tape 15 and second tape 35 to form superconductive interconnection 140. It is also known to form welds of the type described herein using other means for forming the weld, such as laser welding.

Referring to FIGS. 1, 1A, 1B, a method of making articles of the present invention comprises a step of selecting a first metallic tape 15 comprising a first superconductive portion 20, a first longitudinal axis 25 and two opposed tape edge regions 30 and a second metallic tape 35 comprising a second superconductive portion 40, a second longitudinal axis 45 and two opposed tape edge regions 50. This is followed by a step of placing first tape 15 together with second tape 35 so that one of edge regions 30 of first tape 15 overlaps and is in touching contact with one of edge regions 50 of the second tape, thereby forming an area for mechanically and electrically interconnecting 55 first tape 15 and second tape 35. Placing may be done by any suitable method, including placing the tapes by hand. Next is the step of mechanically joining first tape 15 and second tape 35 in area for interconnecting 55 with mechanical joining means 60, such as a weld. The step of joining is followed by electrically connecting first superconductive portion 20 and second superconductive portion 40 with a superconductive electrical interconnection 65 in area for interconnecting 55. The steps of mechanically joining and electrically interconnecting may be done in the same step, such as by welding. Thus, these steps of may be done concurrently. Furthermore, the order of these steps may be interchanged.

Because of the brittle nature of some metallic superconductors, such as Nb$_3$Sn, it may be desirable to join the precursor tapes prior to reacting them. This may be particularly desirable for forming articles other than those comprising flat, planar arrays, such as cylindrical or other shapes. Furthermore, it may be desirable to use forming operations on an article like that of the present invention which may not be possible with tapes in a brittle, reacted condition. Therefore, it may be desirable to join precusor tapes to form a precursor article that may be formed into a desired shape, followed by reacting the tape as described herein to form a superconductive article.

Thus, a second method for making, articles of the present invention may be described, as illustrated in FIGS. 2 and 2A, as comprising: selecting a first metallic precursor tape 15' having a first longitudinal axis 25' and two opposed tape edge regions 30', superconductive tape 15 having, a first superconductive portion 20 and a second metallic precursor tape 35' having a second longitudinal axis 45' and two opposed tape edge regions 50', wherein first precursor tape 15' is adapted to form first superconductive tape 15 having first superconductive portion 20 and second precursor tape 35' is adapted to form second superconductive tape 35 having a second superconductive portion 40. These precursor tapes may be niobium-base alloy tapes that are coated with tin or a tin alloy, as described herein. After selecting, follows the step of placing the first precursor tape 15' together with the second precursor tape 35' so that one of the edge regions 30' of the first precursor tape 15' overlaps and is in touching contact with one of the edge regions 50' of the second tape, thereby forming an area for mechanically and electrically interconnecting 55' of first precursor tape 15' and second precursor tape 35'. Placing may be done by any suitable method, including placing the precursor tapes by hand. After placing the tapes in touching contact, the next step is a step of mechanically joining the first precursor tape 15' and the second precursor tape 35' in the area for interconnecting 55' with a mechanical joining means. Mechanical joining means may be any suitable means for providing a mechanical interconnection between first precusor tape 15' and second precursor tape 35', such as separate fasteners, a continuous weld or plurality of welds, mechanical crimping, or other suitable means. The requirements for joining means 60' will depend upon the intended application of precursor article 10 and the stresses and strains to be incurred in the area for interconnecting 55'. This preferred that joining means 60' comprise a weld between first precursor tape 15' and second precursor tape 35', as described herein, wherein the weld also comprises superconductive interconnection means 65'. In the case where first precursor tape 15 and second precursor tape 35 comprise a niobium-base alloy coated with tin or a tin alloy, the weld would also comprise Nb$_3$Sn, as described herein. While a weld, such as one comprising Nb$_3$Sn may be a sufficient joining means for some applications, the fact that Nb$_3$Sn is known to be brittle may necessitate the joining means 60 also employ additional known mechanical interconnection means, such as any of a number of known fasteners, to join first precursor tape 15' and second precursor tape 35' in area for interconnecting 55'. Following the step of mechanically joining, is the step of electrically connecting the first precursor tape 15' and the second tape 35' with a superconductive interconnection means in the area for interconnecting. Superconductive interconnection means 65' may be any suitable means for providing a superconductive electrical interconnection between first superconductive portion 20' or first precursor tape 15' and second superconductive portion 40' or second precursor tape 35' in area for interconnecting 55'. It is preferred that superconductive interconnection means 65' be a weld comprising a superconductive material. In the case of first precursor tape 15' and second precursor tape 35' being made from a niobium-base alloy coated with tin or a tin alloy, superconductive interconnection means 65' may comprise a weld between these tapes which also comprises superconductive Nb$_3$Sn. Such a weld in illustrated in FIGS. 2 and 2A. Such a weld may have one of the forms described herein. The steps of mechanically joining and electrically connecting may be done in the same step.

The present invention also comprises the combination of a plurality of first precursor tapes 15' and second precursor tapes 35' using the same methods described above to join and interconnect first precursor tape 15' and second precursor tape 35'.

Precursor tapes 15' and 35' that have been mechanically joined may optionally be formed into any number of known shapes that may be formed from such an array, including for example a right circular cylinder or a cone. Such forming may be done using any one of a number of known means for forming thin sheet of a metal alloy.

Once the precursor tapes have been joined and any desired forming has been done, the first precursor tape 15' and the second precursor tape 35' may be reacted using the annealing methods described herein to form first tape 15 and second tape 35 comprising superconductive portions 20 and 40, respectively. Annealing may also form an additional mechanical interconnection between first tape 15 and second tape 35 in the area for interconnecting 55 by reflow and metallurgical bonding of the tin alloy on the surface of the tapes. Annealing also interconnects superconductive interconnection means 65, superconductive portion 20 of first tape 15 and superconductive portion 40 of second tape 35.

The degree of superconductivity of an article 10 can be varied by the number, size and spacing of the plurality of superconductive interconnections 65 that are formed. For example, if the superconductive article 10 is used as a magnetic shield, increasing the spacing of the superconductive interconnections 65 may increase the path length of induced surface currents, particularly in situations where such currents seek to follow a path that may not be contained within a particular tape, thus requiring cross-over from one tape to another via a superconductive interconnection 65.

EXAMPLE 1

A plurality of one inch wide, 25 micron thick niobium tapes were used to form an article of the present invention.

The composition of these tapes was approximately 1 atom percent zirconium, 2 atom percent oxygen and a balance of niobium. These tapes were coated with a layer of a tin-copper alloy by brief immersion in a molten bath that was held at a temperature of about 1050° C. The bath comprised about 10 weight percent copper with a balance of tin. The plurality of coated but unreacted tapes were then woven into a configuration similar to that shown in FIG. 2. After weaving, the tapes were reacted by heating in an argon atmosphere at about 1050° C. for 220 seconds. After reaction, the reacted tapes had a remaining core of the original niobium alloy that ranged between 5.4 and 19.4 microns in thickness, because the process had not been optimized to make the reaction uniform. It would have been preferred to control the thickness of the remaining core to approximately 10–13 microns in thickness. The thickness of the $Nb_3Sn$ reaction layers on either side of the core was between 3–10 microns because of the non-optimized reaction process. A thickness of 6–8 microns would have been more preferred. The outer layers of remaining tin-copper alloy were approximately 2–3 microns thick. The reacted tapes were then interconnected in a plurality of the overlapping regions using chill plates and a TIG welding apparatus as described above to produce a superconductive article. This example demonstrated the formation of a TIG weld, and is analogous to forming such a weld between a tab and the second tape. The welds used in this overlapping configuration are analogous to the welds described herein in articles of the present invention.

EXAMPLE 2

The superconductive character of the interconnections was also tested to ensure that the articles were truly superconductive. This was done by overlapping pieces of 10.3 mm wide reacted tape and forming a plurality of interconnections having different diameters between them using the TIG welding method described above. The critical currents of these interconnections were then measured at a temperature of 4.2° K in a magnetic field of 5T. The resulting data are shown in Table 1 below:

TABLE 1

| Interconnection Dia. (Bore Dia.) (mm) | Critical Current (Ic) (amps) |
| --- | --- |
| 4.8 | >600 |
| 4.1 | 485 |
| 2.8 | 345 |
| 2.0 | 350 |

This data indicates that the interconnections formed using a combination of TIG welding and chill plates as described herein are truly superconductive, and that a plurality of such interconnections may be used to form superconductive articles of the present invention.

It will be apparent to those skilled in the art, that although the invention has been described in terms of specific examples, modifications and changes may be made to the disclosed embodiments without departing from the essence of the invention. It is, therefore, to be understood, that the appended claims are intended to cover all modifications which naturally flow from the foregoing treatise and examples.

What is claimed is:

1. A superconductive article, comprising:

a first metallic tape comprising a first superconductive portion, a first longitudinal axis and two opposed tape edge regions;

a second metallic tape comprising a second superconductive portion, a second longitudinal axis and two opposed tape edge regions, wherein one of the edge regions of said first tape overlaps and is in touching contact with one of the edge regions of said second tape, thereby forming an area for interconnecting said first tape and said second tape;

joining means providing a mechanical interconnection between said first tape and said second tape in the area for interconnecting; and superconductive interconnection means providing a superconductive electrical interconnection between the first superconductive portion and the second superconductive portion in the area for interconnecting, wherein the mechanically and superconductively interconnected first and second tapes comprise a superconductive article.

2. The superconductive article of claim 1, wherein said first tape and said second tape are each from the group consisting of niobium-base, tantalum-base, technetium-base and vanadium-base alloys with at least one alloy constituent from the group consisting of tin, aluminum, silicon and gallium.

3. The superconductive article of claim 1, wherein said first tape and said second tape each comprise $Nb_3Sn$.

4. The superconductive article of claim 1, wherein said first tape and said second tape each comprise a niobium alloy core, a superconductive portion comprising a $Nb_3Sn$ layer that is metallurgically bonded to the niobium alloy core, and a coating of a tin alloy that is metallurgically bonded to and at least partially covering the $Nb_3Sn$ layer.

5. The superconductive article of claim 4, wherein said superconductive interconnection means is a weld comprising $Nb_3Sn$ located within the area for interconnecting that electrically interconnects the first superconductive portion and the second superconductive portion.

6. The superconductive article of claim 5, wherein the weld also comprises said joining means.

7. The superconductive article of claim 1, wherein the longitudinal axis of said first tape and the longitudinal axis of said second tape are parallel.

8. A method of making a superconductive article, comprising the steps of:

selecting a first metallic tape comprising a first superconductive portion, a first longitudinal axis and two opposed tape edge regions and a second metallic tape comprising a second superconductive portion, a second longitudinal axis and two opposed tape edge regions;

placing the first tape together with the second tape so that one of the edge regions of the first tape overlaps and is in touching contact with one of the edge regions of the second tape, thereby forming an area for mechanically and electrically interconnecting the first tape and the second tape;

mechanically joining the first tape and the second tape in the area for interconnecting with a mechanical joining means;

electrically connecting the first superconductive portion and the second superconductive portion with a superconductive interconnection means in the area for interconnecting.

9. The method of claim 8, wherein the first tape and the second tape each comprise a superconductive alloy from the group consisting of niobium-base, tantalum-base, technetium-base and vanadium-base alloys with at least one alloy constituent from the group consisting of tin, aluminum, silicon and gallium.

10. The superconductive article of claim 8, wherein the first superconductive portion and the second superconductive portion each comprise $Nb_3Sn$.

11. The superconductive article of claim 8, wherein the first tape and the second tape each comprise a niobium alloy core, a $Nb_3Sn$ layer comprising the superconductive portion that is metallurgically bonded to the niobium alloy core, and a coating of a tin alloy that is metallurgically bonded to and at least partially covering the $Nb_3Sn$ layer.

12. The method of claim 11, wherein said step of electrically connecting is accomplished by welding the first tape and the second tape together in the area for interconnecting to form a superconductive weld that is electrically connected to the first superconductive portion and the second superconductive portion.

13. The method of claim 12, wherein the welding comprises TIG or laser welding.

14. The method of claim 13, wherein the welding also comprises the step of mechanically joining.

15. The method of claim 12, wherein the weld comprises $Nb_3Sn$.

16. A method of making a superconductive article, comprising the steps of:

selecting a first metallic precursor tape having a first longitudinal axis and two opposed tape edge regions; and a second metallic precursor tape having a second longitudinal axis and two opposed tape edge regions, wherein the first precursor tape is adapted to form a first superconductive tape having a first superconductive portion and a second superconductive tape having a second superconductive portion;

placing the first precursor tape together with the second precursor tape so that one of the edge regions of the first tape overlaps and is in touching contact with one of the edge regions of the second tape, thereby forming an area for mechanically and electrically interconnecting the first precursor tape and the second precursor tape;

mechanically joining the first precursor tape and the second precursor tape in the area for interconnecting with a mechanical joining means;

electrically connecting the first precursor tape and the second precursor tape with a superconductive interconnection means in the area for interconnecting; and reacting the first precursor tape and the second precursor tape to form the first superconductive tape and the second superconductive tape, whereby the first superconductive portion and the second superconductive portion are electrically connected by the superconductive interconnection means.

17. The method of claim 16, wherein the first precursor tape and the second precursor tape each comprise a niobium alloy tape that is coated with a layer of a tin alloy.

18. The method of claim 16, wherein said step of electrically connecting is accomplished by welding the first precursor tape and the second precursor tape together in the area for interconnecting to form a superconductive weld that is electrically connected to the first precursor tape and the second precursor tape.

19. The method of claim 18, wherein the welding comprises TIG or laser welding.

20. The method of claim 18, wherein the welding also comprises the step of mechanically joining.

21. The method of claim 16, wherein the superconductive interconnection means, the first superconductive portion and the second superconductive portion each comprise $Nb_3Sn$.

* * * * *